(12) United States Patent
Subramanian et al.

(10) Patent No.: US 6,326,231 B1
(45) Date of Patent: *Dec. 4, 2001

(54) USE OF SILICON OXYNITRIDE ARC FOR METAL LAYERS

(75) Inventors: Ramkumar Subramanian, San Jose; Bhanwar Singh, Morgan Hill; Sanjay K. Yedur, Santa Clara; Marina V. Plat, San Jose; Christopher F. Lyons, Fremont; Bharath Rangarajan, Santa Clara; Michael K. Templeton, Atherton, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,562

(22) Filed: Dec. 8, 1998

(51) Int. Cl.$^7$ .................................................. H01L 21/00
(52) U.S. Cl. ........................... 438/72; 438/770; 438/778; 438/787; 438/69
(58) Field of Search ................. 438/69, 72, 769, 438/770, 775, 778, 787

(56) References Cited

U.S. PATENT DOCUMENTS

| | | | |
|---|---|---|---|
| 4,527,007 | * 7/1985 | Fuse | 136/256 |
| 5,230,746 | * 7/1993 | Wiedeman et al. | 136/249 |
| 5,441,914 | * 8/1995 | Taft et al. | 437/189 |
| 5,580,815 | * 12/1996 | Hsu et al. | 437/69 |
| 5,639,687 | * 6/1997 | Roman et al. | 437/186 |
| 5,672,243 | 9/1997 | Hsia et al. | 156/659.11 |
| 5,710,067 | 1/1998 | Foote et al. | 437/238 |
| 5,721,167 | * 2/1998 | Subramanian et al. | 438/238 |
| 5,880,018 | * 3/1999 | Boeck et al. | 438/619 |
| 5,918,147 | * 6/1999 | Filipiak et al. | 438/636 |
| 6,004,850 | * 12/1999 | Lucas et al. | 438/301 |
| 6,013,582 | * 1/2000 | Ionov et al. | 438/738 |
| 6,030,541 | * 2/2000 | Adkisson et al. | 216/51 |
| 6,156,620 | * 12/2000 | Puchner et al. | 438/400 |

* cited by examiner

Primary Examiner—Matthew Smith
Assistant Examiner—Renzo N. Rocchegiani
(74) Attorney, Agent, or Firm—Renner, Otto, Boisselle & Sklar, LLP

(57) ABSTRACT

In one embodiment, the present invention relates to a method of forming a silicon oxynitride antireflection coating over a metal layer, involving the steps of providing a semiconductor substrate comprising the metal layer over at least part of the semiconductor substrate; depositing a silicon oxynitride layer over the metal layer having a thickness from about 100 Å to about 150 Å; and forming an oxide layer having a thickness from about 5 Å to about 50 Å over the silicon oxynitride layer to provide the silicon oxynitride antireflection coating. In another embodiment, the present invention relates to a method of reducing an apparent reflectivity of a metal layer having a first reflectivity in a semiconductor structure, involving forming a silicon oxynitride antireflection coating over the metal layer; wherein the silicon oxynitride antireflection coating formed over the metal layer has a second reflectivity and is formed by depositing silicon oxynitride on the metal layer by chemical vapor deposition and forming an oxide layer over the oxynitride, and the difference between the first reflectivity and the second reflectivity is at least about 60%.

20 Claims, 1 Drawing Sheet

USE OF SILICON OXYNITRIDE ARC FOR METAL LAYERS

TECHNICAL FIELD

The present invention generally relates to making and using a silicon oxynitride antireflection coating over highly reflective underlying layers. In particular, the present invention relates to providing a silicon oxynitride antireflection coating having an oxide layer well suited for use with deep UV photoresists.

BACKGROUND ART

Microlithography processes for making miniaturized electronic components, such as in the fabrication of computer chips and integrated circuits, involve using photoresists.

Generally, a coating or film of a photoresist is applied to a substrate material, such as a silicon wafer used for making integrated circuits. The substrate may contain any number of layers or devices thereon. The photoresist coated substrate is baked to evaporate any solvent in the photoresist composition and to fix the photoresist coating onto the substrate. The baked coated surface of the substrate is next subjected to selective radiation; that is, an image-wise exposure to radiation.

This radiation exposure causes a chemical transformation in the exposed areas of the photoresist coated surface. Types of radiation commonly used in microlithographic processes include visible light, ultraviolet (UV) light, electron beam and X-ray radiant energy. After selective exposure, the photoresist coated substrate is treated with a developer solution to dissolve and remove either the radiation-exposed or the unexposed areas of the photoresist.

Especially with the trend towards miniaturization of semiconductor devices, there are problems that result from the back reflection of light from highly reflective substrates (back reflection from layers underneath the photoresist). Two deleterious effects of back reflectivity are thin film interference and reflective notching. Thin film interference results in a changes in critical linewidth dimensions caused by variations in the total light intensity in the photoresist film as the thickness of the photoresist changes. Reflective notching becomes severe as the photoresist is patterned over substrates containing topographical features, which tend to scatter light through the photoresist film, leading to linewidth variations, and in extreme cases, forming regions with complete photoresist loss.

Dyed photoresists have been utilized in an effort to solve these reflectivity problems. However, dyed photoresists only reduce reflectivity from the underlying substrate, they do not totally eliminate the reflectivity. Additional shortcomings associated with dyed photoresists are that dyed photoresists tend to cause reduction in the lithographic performance of the photoresist, the undesirable possible sublimation of the dye, and incompatibility of the dye in the photoresist films.

To prevent reflection of activating radiation into a photoresist coating, it is known to provide antireflection layers or antireflection coatings (ARCs) between a substrate and a photoresist layer. ARCs generally function by absorbing the radiation used for exposing the photoresist; that is, reducing reflectivity at the photoresist/underlying substrate interface. ARCs may comprise an absorbing dye dispersed in a polymer binder, though some polymers contain sufficient chromopores (or characteristics thereof) whereby a dye is not required. When used, the dye is selected to absorb and attenuate radiation at the wavelength used to expose the photoresist layer thus reducing the incidence of radiation reflected back into the photoresist layer. During conventional processing of an integrated circuit substrate coated with the combination of an ARC and a photoresist layer, the photoresist is patterned to form a mask defining a desired pattern.

To alter the underlying substrate, the ARC must be removed to bare the underlying substrate in a desired pattern. However, there are problems associated with removal of the ARC including incomplete removal, and/or undesirable damage, removal or interaction with the photoresist or underlying substrate. In addition to difficulties associated with removal of an ARC, other problems are often encountered when an ARC is used in combination with a photoresist coating. One such problem is that of selecting an antireflective coating that is compatible with the photoresist used. The ARC should be inert with respect to the photoresist coating while firmly bonding to the photoresist coating. Another problem is that of selecting an ARC that firmly bonds to the underlying substrate to avoid lift-off of the unremoved photoresist coating (from development) during processing of the underlying substrate. There are also problems associated with selecting ARCs having desirable properies at certain wavelengths that simultaneously possess the above mentioned desirable compatibility properties.

Titanium nitride is conventionally used as an ARC. However, when a titanium nitride ARC is used over a metal layer having a high reflectivity (for example, about 80%), reflectivity concerns continue to exist, especially at shorter wavelength irradiation (for example, about 248 nm or 365 nm). This is because the reflectivity of a titanium nitride ARC over a metal layer generally does not go below about 25%.

Moreover, with specific regard to deep ultraviolet (UV) photoresists, compatibility concerns exist with ARCs that contain nitrogen. This is because nitrogen deleteriously effects deep UV photoresists. In particular, nitrogen may migrate from the ARC and poison a deep UV photoresist by desensitizing them to UV light, thus inhibiting development of the photoresist. Desensitized deep UV photoresists exhibit extremely poor pattern definition after development.

SUMMARY OF THE INVENTION

The present invention provides an ARC containing a silicon oxynitride layer and an oxide layer with improved optical characteristics that lead to improved critical dimension control. The present invention also provides a silicon oxynitride ARC that is compatible with deep UV photoresists since a thin oxide layer prevents nitrogen from the silicon oxynitride layer from contacting an overlying photoresist, more extensively enabling the use of deep UV photoresists. The presence of the thin oxide layer over the silicon oxynitride layer enable reworking of the photoresist since the oxide layer is not damaged and protects the silicon oxynitride layer from attack by reworking chemicals. Moreover, the present invention provides a silicon oxynitride ARC that may be tailored to the optical properties of an underlying metal layer. As a result, the present invention effectively addresses the concerns raised by the trend towards the miniaturization of semiconductor devices.

In one embodiment, the present invention relates to a method of forming a silicon oxynitride antireflection coating over a metal layer, involving the steps of providing a semiconductor substrate comprising the metal layer over at least part of the semiconductor substrate; depositing a silicon oxynitride layer over the metal layer having a thickness from about 100 Å to about 1500 Å; and forming an oxide layer having a thickness from about 5 Å to about 50 Å over the silicon oxynitride layer to provide the silicon oxynitride antireflection coating.

In another embodiment, the present invention relates to a method of reducing an apparent reflectivity of a metal layer having a first reflectivity in a semiconductor structure, involing forming a silicon oxynitride antireflection coating over the metal layer; wherein the silicon oxynitride antireflection coating formed over the metal layer has a second reflectivity and is formed by depositing silicon oxynitride on the metal layer by chemical vapor deposition and forming an oxide layer over the silicon oxynitride, and the difference between the first reflectivity and the second reflectivity is at least about 60%.

In yet another embodiment, the present invention relates to a method of processing a semiconductor substrate, involving the steps of providing a semiconductor substrate comprising a metal layer having a reflectivity of at least 80%; forming a silicon oxynitride antireflection coating over the metal layer having a thickness from about 100 Å to about 1500 Å, the silicon oxynitride antireflection coating comprising an oxide layer over a silicon oxynitride layer; depositing a deep ultraviolet photoresist over the silicon oxynitride antireflection coating; selectively irradiating the deep ultraviolet photoresist with electromagnetic radiation having a wavelength of about 248 nm or less; and developing the deep ultraviolet photoresist.

DISCLOSURE OF INVENTION

Figure 1:
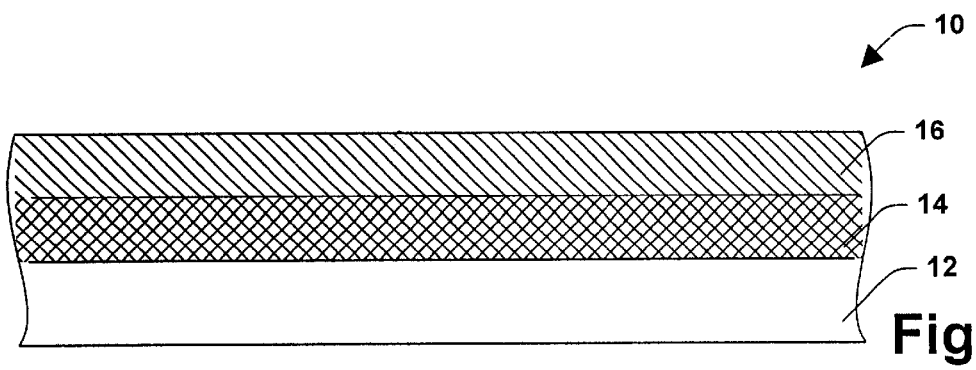
FIG. 1 illustrates in a cross-sectional view the methods according to one aspect of the present invention.

The present invention involves making and using a silicon oxynitride ARC over highly reflective underlying layers. The silicon oxynitride ARC contains a silicon oxynitride layer and a thin oxide layer. In this connection, the silicon oxynitride ARC may be termed an oxide-silicon oxynitride ARC. The present invention more specifically involves making and using a silicon oxynitride ARC over underlying metal layers over which the reflectivity of the ARC is altered or controlled by adjusting the ratios of components and the thickness of the silicon oxynitride portion of the ARC. The optical properties of an underlying layer (a layer over which an ARC is formed) may dictate the degree of reflectivity that the ARC must possess. The present invention also involves making and using a silicon oxynitride ARC with a deep UV photoresist.

The ARCs of the present invention are used over an underlying layer having a reflectivity that may deleteriously affect the photoresist patterning process. In one embodiment, the underlying layer is a metal layer. In another embodiment, the underlying layer is a conductive metal layer. Metal layers include layers of a single metal as well as metal alloy layers containing two or more metals. Specific examples of underlying layers include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof. Although the reflectivity may vary for each such metal layer, typically metal layers have reflectivities of about 70% to about 90% or more. For example, aluminum has a reflectivity of about 80% or more.

The silicon oxynitride ARC of the present invention is made by initially forming a silicon oxynitride layer on an underlying layer. The silicon oxynitride layer can be formed using any suitable technique including chemical vapor deposition (CVD) techniques, such as low pressure chemical vapor deposition (LPCVD) or plasma enhanced chemical vapor deposition (PECVD). In one embodiment, the silicon oxynitride layer is formed using LPCVD techniques at temperatures from about 600° C. to about 900° C. using a nitrogen containing gas, an oxygen containing gas and a silicon containing gas, such as using $SiH_4$, $N_2O$ and $N_2$ or $NH_3$. In another embodiment, the silicon oxynitride layer is formed using PECVD techniques at temperatures from about 200° C. to about 400° C. using a nitrogen containing gas, an oxygen containing gas and a silicon containing gas, such as using $SiH_4$, $N_2O$ and $N_2$ or $NH_3$. The relative amounts of oxygen and nitrogen incorporated into the initial silicon oxynitride layer can be varied by varying the flow rates of the nitrogen containing gas and the oxygen containing gas. Although termed a silicon oxynitride layer herein, the initial silicon oxynitride layer formed in accordance with the present invention may contain hydrogen, and thus in one embodiment is characterized by the chemical formula SiON:H.

In one embodiment, the initial silicon oxynitride layer has a thickness from about 100 Å to about 1500 Å. In another embodiment, the initial silicon oxynitride layer has a thickness from about 125 Å to about 1400 Å. In yet another embodiment, the initial silicon oxynitride layer has a thickness from about 150 Å to about 1300 Å.

After a silicon oxynitride layer is formed, a thin oxide layer is formed over the top surface of the silicon oxynitride layer to form the oxide-silicon oxynitride ARC. The thin oxide layer prevents nitrogen atoms of the silicon oxynitride layer from contacting the subsequently applied photoresist. During rework of a poorly applied or poorly developed photoresist, the thin oxide layer protects the silicon oxynitride layer against chemical attack and/or degradation by rework chemicals. The thin oxide layer is formed over the silicon oxynitride layer by any suitable manner.

In one embodiment, oxygen plasma is contacted with the silicon oxynitride layer to form an oxide layer over the silicon oxynitride layer. In another embodiment, $N_2O$ plasma is contacted with the silicon oxynitride layer to form an oxide layer over the silicon oxynitride layer. In both of these embodiments, an inert or carrier gas may be present during the plasma treatment. In yet another embodiment, CVD (PECVD or LPCVD) techniques are employed to deposit an oxide layer over the silicon oxynitride layer. In this embodiment, $SiH_4$, and one of $N_2O$ and $O_2$ are used to form an oxide layer.

In one embodiment, the thin oxide layer has a thickness from about 5 Å to about 50 Å. In another embodiment, the thin oxide layer has a thickness from about 10 Å to about 40 Å. In yet another embodiment, the thin oxide layer has a thickness from about 15 Å to about 35 Å.

The silicon oxynitride ARC is formed to a suitable thickness to exhibit a desired reflectivity. In one embodiment, the silicon oxynitride ARC formed in accordance with the present invention has a thickness from about 100 Å to about 1500 Å. In another embodiment, the silicon oxynitride ARC has a thickness from about 125 Å to about 1400 Å. In yet another embodiment, the silicon oxynitride ARC has a thickness from about 150 Å to about 1300 Å. In a preferred embodiment, the silicon oxynitride ARC has a thickness from about 125 Å to about 600 Å.

The reflectivity of the resultant silicon oxynitride ARC depends upon a number of factors including the ratio of silicon oxynitride components (the relative amounts of oxygen and nitrogen), the thickness of the initial silicon oxynitride layer, the thickness of the thin oxide layer and the thickness of the resultant silicon oxynitride ARC.

In one embodiment, a silicon oxynitride ARC having a thickness of about 200 Å (including an oxide layer having a thickness of about 50 Å) formed over an aluminum layer has a reflectivity from about 0% to about 10% (below about 10%) at a wavelength of about 248 nm. In another embodiment, a silicon oxynitride ARC having a thickness of about 200 Å formed over an aluminum layer has a reflectivity from about 1% to about 5% (below about 5%) at a wavelength of about 248 nm. In yet another embodiment, a silicon oxynitride ARC having a thickness of about 350 Å (including an oxide layer having a thickness of about 50 Å) formed over an aluminum layer has a reflectivity from about 1% to about 10% (below about 10%) at a wavelength of about 365 nm. In still yet another embodiment, a silicon oxynitride ARC having a thickness of about 350 Å (including an oxide layer having a thickness of about 50 Å) formed over an aluminum layer has a reflectivity from about 0.1% to about 5% (below about 5%) at a wavelength of about 365 nm.

In this connection, the silicon oxynitride ARC reduces the apparent reflectivity of an underlying metal (comparing the reflectivity of a metal layer with the reflectivity of a silicon oxynitride ARC according to the present invention over the metal layer). In one embodiment, the difference between the reflectivity of the metal layer and the reflectivity of the silicon oxynitride ARC is at least about 60% (for instance, a metal layer having a reflectivity of 70% and a silicon oxynitride ARC having a reflectivity of 8%). In another embodiment, the difference between the reflectivity of the metal layer and the reflectivity of the silicon oxynitride ARC is at least about 70%. In yet another embodiment, the difference between the reflectivity of the metal layer and the reflectivity of the silicon oxynitride ARC is at least about 75%.

The silicon oxynitride ARC formed in accordance with the present invention has strong absorption characteristics at wavelengths below about 425 nm. In another embodiment, the silicon oxynitride ARC formed in accordance with the present invention has strong absorption characteristics at wavelengths below about 365 nm. In yet another embodiment, the silicon oxynitride ARC formed in accordance with the present invention has strong absorption characteristics at wavelengths below about 248 nm. As a result, the silicon oxynitride ARC is well suited for use with deep UV photoresists. Specific examples of wavelengths at which the silicon oxynitride ARC exhibits reflectivities below about 20% include about 405 nm, about 365 nm, about 308 nm, about 290 nm, about 280 nm, about 265 nm, about 248 nm, about 193 nm and about 157 nm.

Any photoresist material may be used as a photoresist over the silicon oxynitride ARC formed in accordance with the present invention. For example, a 193 nm sensitive photoresist, an I-line, H-line, G-line, E-line, deep UV or chemically amplified photoresist material may be spin-coated on the silicon oxynitride ARC. Photoresists are commercially available from a number of sources, including Shipley Company, Kodak Hoechst Celanese Corporation, Brewer and IBM. The photoresist is typically applied to a thickness from about 5,000 Å to about 15,000 Å, although the thickness of the photoresist is not critical to the invention.

Figure 2:
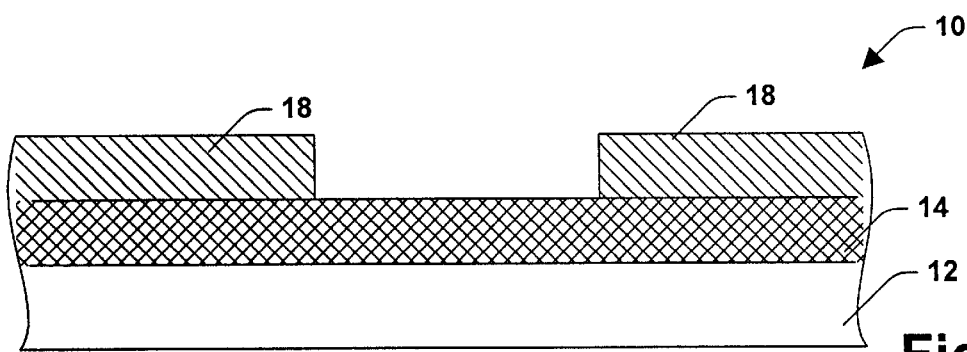
FIG. 2 illustrates in a cross-sectional view the methods according to one aspect of the present invention.

Referring to FIGS. 1 and 2, a general embodiment of the present invention is described. A portion of a semiconductor structure 10 is shown with underlying substrate 12.

Underlying substrate 12 may be one or more layers of semiconductor materials wherein the top surface has a relatively high reflectivity (for example, above about 70%). A silicon oxynitride ARC 14 is formed over the underlying substrate 12 using a two-step process; namely, forming a silicon oxynitride layer by suitable CVD techniques followed by forming a thin oxide layer over the silicon oxynitride layer thereby forming a silicon oxynitride ARC having a desired thickness. The relative amounts of oxygen and nitrogen used to form the silicon oxynitride layer, the thickness of the silicon oxynitride layer, the thickness of the oxide layer and the thickness of the resultant silicon oxynitride ARC may be modified to adjust the reflectivity of the resultant silicon oxynitride ARC in light of the specific reflectivity of the underlying substrate 12. In preferred embodiments of using the silicon oxynitride ARC 14, the underlying layer 12 contains at least two layers wherein the top or uppermost layer is a metal layer (such as a single metal layer or metal alloy layer). A suitable photoresist 16 is deposited over the silicon oxynitride ARC 14 using known techniques. For example, the photoresist 16 is deposited using conventional spin-coating techniques.

Referring to FIG. 2, the photoresist 16 is then patterned using suitable photolithographic techniques resulting in the formation of a pattern 18. The pattern 18 is formed using electromagnetic radiation having a relatively small wavelength (for example, less than 425 nm). The exposed portion of the silicon oxynitride ARC 14 may have any desired cross-section or line-width, such as about 0.35 µm, about 0.25 µm, about 0.18 µm, about 0.15 µm, about 0.1 µm and/or about 0.05 µm. The photoresist pattern 18 is then used as a mask in subsequent processing of the semiconductor structure 10. For example, the photoresist pattern 18 may be used as an etch mask for patterning the silicon oxynitride ARC 14 and the underlying substrate 12.

Due to the presence of the silicon oxynitride ARC 14, energy which passes through the photoresist 16 is not reflected back into the photoresist 16 by the underlying layer 12 to the extent it would have been reflected back without the silicon oxynitride ARC 14. As a result of the present invention, improved critical dimension control is achieved as the dimensions of the patterns and/or various openings in the patterned photoresist 18 are controllable, crisp and of high quality. Additional layers can be incorporated into semiconductor structure 10 so long as the silicon oxynitride ARC 14 can function at least as an antireflection layer.

Figure 3:
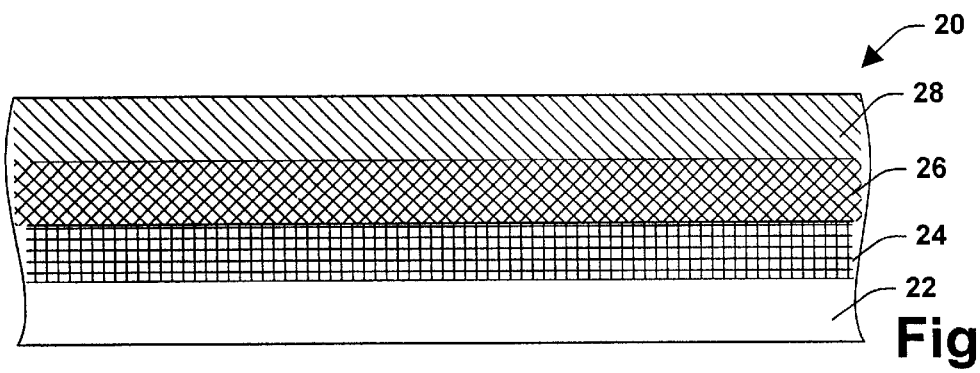
FIG. 3 illustrates in a cross-sectional view the methods according to one aspect of the present invention.
Figure 4:
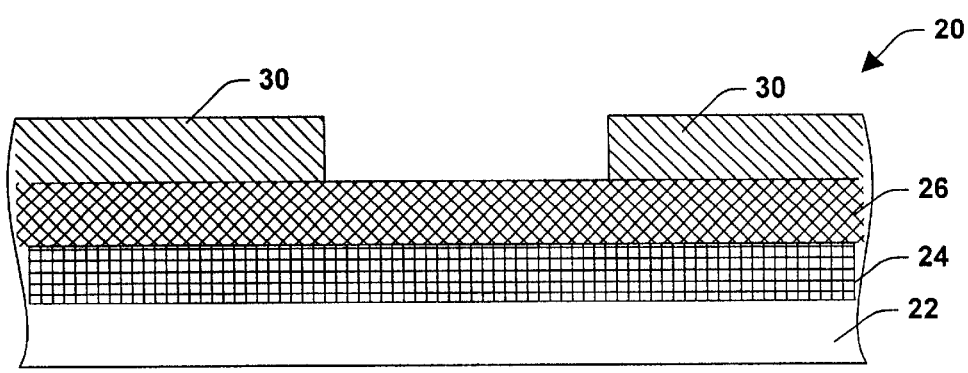
FIG. 4 illustrates in a cross-sectional view the methods according to one aspect of the present invention.

Referring to FIGS. 3 and 4, a specific embodiment of the present invention is described. A portion of a semiconductor structure 20 is shown with a semiconductor substrate layer 22 and an aluminum layer 24 formed on the semiconductor structure 20. Semiconductor layer 22 is made of one or more layers including substrate layers, diffusion regions, dielectric layers such as oxides and nitrides, devices, polysilicon layers, and the like. Although shown as continuous, the aluminum layer 24 may be continuous or intermittent. A silicon oxynitride ARC 26 is formed over the aluminum layer 24 using a two-step process; namely, forming a silicon oxynitride layer by suitable CVD techniques followed by exposing the silicon oxynitride layer to oxygen plasma for a time sufficient to form an oxide layer having a thickness of about 50 Å thereby forming a silicon oxynitride ARC. In particular, PECVD is performed at a temperature about 300° C. using $N_2O$, $N_2$ and $SiH_4$. The silicon oxynitride layer has a thickness of about 150 Å and the silicon oxynitride ARC has a thickness of about 200 Å. A suitable photoresist 28, such as a deep UV photoresist is deposited over the silicon oxynitride ARC 26 using spin-coating techniques.

Referring to FIG. 4, the photoresist 28 is then patterned using suitable photolithographic techniques resulting in the formation of a photoresist pattern 30. The photoresist pattern 30 is formed using electromagnetic radiation having a wavelength of about 248 nm. The exposed portion of the silicon oxynitride ARC 26 may have any desired cross-section or line-width, such as about 0.35 $\mu$m, about 0.25 $\mu$m, about 0.18 $\mu$m, about 0.15 $\mu$m, about 0.1 $\mu$m and/or about 0.05 $\mu$m. The photoresist pattern 30 is then used as a mask in subsequent processing of the semiconductor structure 20. For example, the photoresist pattern 30 may be used as an etch mask for patterning the silicon oxynitride ARC 26 and the aluminum layer 24.

Due to the presence of the silicon oxynitride ARC 26, energy which passes through the photoresist 28 tends not to be reflected back into the photoresist 28 by the highly reflective underlying aluminum layer 24 to the extent it would have been reflected back without the silicon oxynitride ARC 26. As a result of the present invention, improved critical dimension control is achieved as the dimensions of the patterns and/or various openings in the patterned photoresist 30 are controllable, crisp and of high quality. In another embodiment, additional layers can be incorporated into semiconductor structure 10 so long as the silicon oxynitride ARC 26 can function at least as an antireflection layer.

In another embodiment, again referring to FIGS. 3 and 4, the present invention relates to using a metal layer 24 of one of copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and metal silicides instead of the aluminum layer 24.

The precise amount of oxygen and nitrogen incorporated into the initial silicon oxynitride layer, the thickness of the silicon oxynitride layer, the thickness of the oxide layer and the thickness of the resultant silicon oxynitride ARC determine the reflectivity of the resultant silicon oxynitride ARC, which in turn may be selected in light of the reflectivity of the specific underlying metal layer. Reflective notching in submicron photoresist patterns is thus minimized and/or eliminated by using the silicon oxynitride ARCs in accordance with the invention.

Moreover, since the oxide layer of the silicon oxynitride ARC prevents nitrogen atoms from migrating from the silicon oxynitride layer to the photoresist, deep UV photoresists, which tend to be deleteriously effected by nitrogen atoms, may be used in combination with the silicon oxynitride based ARC of the present invention. And since the thin oxide layer protects the silicon oxynitride layer against chemical attack and/or since the thin oxide layer is not substantially degraded by rework chemicals, rework of a poorly applied or poorly developed photoresist is facilitated even though a silicon oxynitride based ARC is employed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a silicon oxynitride antireflection coating over a metal layer, comprising:

providing a semiconductor substrate comprising the metal layer over at least part of the semiconductor substrate;

depositing a silicon oxynitride layer on the metal layer having a thickness from about 100 Å to about 1500 Å; and forming an oxide layer having a thickness from about 5 Å to about 50 Å over the silicon oxynitride layer to provide the silicon oxynitride antireflection coating, wherein the oxide layer forms a barrier to migration of nitrogen atoms from the silicon oxynitride layer.

2. The method of claim 1, wherein the metal layer comprises at least one of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and metal silicides.

3. The method of claim 1, wherein the metal layer comprises at least one of aluminum, copper, aluminum-copper alloys, aluminum alloys and copper alloys.

4. The method of claim 1, wherein the oxide layer is formed by contacting the silicon oxynitride layer with oxygen plasma.

5. The method of claim 1, wherein the oxide layer is formed by contacting the silicon oxynitride layer with $N_2O$ plasma.

6. The method of claim 1, wherein the oxide layer is formed by chemical vapor deposition techniques using $SiH_4$ and at least one of $N_2O$ and $O_2$.

7. The method of claim 1, wherein the silicon oxynitride antireflection coating has a reflectivity of about 10% or less at a wavelength below about 248 nm.

8. A method of reducing an apparent reflectivity of a metal layer having a first reflectivity in a semiconductor structure, comprising forming a silicon oxynitride antireflection coating on the metal layer; wherein the silicon oxynitride antireflection coating formed over the metal layer has a second reflectivity and is formed by depositing silicon oxynitride on the metal layer by chemical vapor deposition and forming an oxide layer having a thickness from about 5 Å to about 50 Å over the silicon oxynitride, and the difference between the first reflectivity and the second reflectivity is at least about 60%, wherein the oxide layer forms a barrier to migration of nitrogen atoms from the silicon oxynitride layer.

9. The method of claim 8, wherein the metal layer comprises at least one of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and metal silicides.

10. The method of claim 8, wherein second reflectivity is about 5% or less.

11. The method of claim 8, wherein the difference between the first reflectivity and the second reflectivity is determined at a wavelength below about 425 nm.

12. The method of claim 8, wherein the difference between the first reflectivity and the second reflectivity is determined at a wavelength below about 365 nm.

13. The method of claim 8, wherein the silicon oxynitride antireflection coating has a thickness from about 125 Å to about 1400 Å.

14. The method of claim 8, wherein the chemical vapor deposition is one of plasma enhanced chemical vapor deposition and low pressure chemical vapor deposition.

15. A method of processing a semiconductor substrate, comprising:

providing a semiconductor substrate comprising a metal layer having a reflectivity of at least 80%;

forming a silicon oxynitride antireflection coating on the metal layer having a thickness from about 100 Å to about 1500 Å, the silicon oxynitride antireflection coating comprising an oxide layer having a thickness from about 5 Å to about 50 Å over a silicon oxynitride layer;

depositing a deep ultraviolet photoresist over the silicon oxynitride antireflection coating;

selectively irradiating the deep ultraviolet photoresist with electromagnetic radiation having a wavelength of about 248 nm or less; and developing the deep ultraviolet photoresist, wherein the oxide layer forms a barrier to migration of nitrogen atoms from the silicon oxynitride layer.

16. The method of claim 15, wherein the metal layer comprises at least one of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and metal silicides.

17. The method of claim 15, wherein the silicon oxynitride ARC is formed by depositing a silicon oxynitride layer by chemical vapor deposition and contacting the silicon oxynitride layer with at least one of a oxygen plasma and a $N_2O$ plasma.

18. The method of claim 17, wherein the silicon oxynitride layer is deposited using one of plasma enhanced chemical vapor deposition and low pressure chemical vapor deposition.

19. The method of claim 15, wherein the electromagnetic radiation has a wavelength of at least one of about 365 nm, about 248 nm, about 193 nm and about 157 nm.

20. The method of claim 15, wherein the deep ultraviolet photoresist is developed to yield fine patterns on the order of 0.25 µm.

* * * * *